(12) United States Patent
Ikeda et al.

(10) Patent No.: US 12,721,207 B2
(45) Date of Patent: Aug. 25, 2026

(54) SEMICONDUCTOR DEVICE INCLUDING SEMICONDUCTOR ELEMENT AND LEAD-FREE SOLDER BONDING MATERIAL AND METHOD FOR MANUFACTURING THE SAME

(71) Applicant: Hitachi Power Semiconductor Device, Ltd., Hitachi (JP)

(72) Inventors: Osamu Ikeda, Tokyo (JP); Masato Nakamura, Hitachi (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 622 days.

(21) Appl. No.: 18/033,543

(22) PCT Filed: Oct. 14, 2021

(86) PCT No.: PCT/JP2021/038131
§ 371 (c)(1),
(2) Date: Apr. 24, 2023

(87) PCT Pub. No.: WO2022/137754
PCT Pub. Date: Jun. 30, 2022

(65) Prior Publication Data

US 2023/0402420 A1 Dec. 14, 2023

(30) Foreign Application Priority Data

Dec. 23, 2020 (JP) ................................. 2020-213897

(51) Int. Cl.
*H10W 72/30* (2026.01)
*H10W 72/00* (2026.01)
*H10W 90/00* (2026.01)

(52) U.S. Cl.
CPC ......... *H10W 72/30* (2026.01); *H10W 72/073* (2026.01); *H10W 72/07336* (2026.01);
(Continued)

(58) Field of Classification Search
CPC ......... H01L 24/26; H01L 24/27; H01L 24/29; H01L 24/32; H01L 24/33; H01L 24/83;
(Continued)

(56) References Cited

U.S. PATENT DOCUMENTS 10,157,877 B2 * 12/2018 Kido .................... B23K 35/025
2006/0186550 A1 8/2006 Ikeda et al.
(Continued)

FOREIGN PATENT DOCUMENTS

CN 109075159 A 12/2018
CN 110520974 A 11/2019
(Continued)

OTHER PUBLICATIONS

JP2014003339A "Semiconductor device and connection structure, and manufacturing methods thereof" machine English translation, pp. 1-7. (Year: 2014).*
(Continued)

*Primary Examiner* — Khiem D Nguyen
(74) *Attorney, Agent, or Firm* — Baker Botts L.L.P

(57) ABSTRACT

A semiconductor device comprises: a diode element with a main surface having an electrode and a back surface having another electrode; a heat dissipation base arranged to face the diode element; a Cu lead arranged to face the diode element; a bonding material which bonds the back surface of the diode element and the heat dissipation base to each other; and a bonding material which bonds the main surface of the diode element and the Cu lead to each other. The bonding material provided on the back surface side of the diode element is a lead-free solder having a melting point higher
(Continued)

than 260° C. and a thermal expansion coefficient lower than that of a Zn—Al solder; and the bonding material provided on the main surface side of the diode element contains a high-melting-point metal having a melting point higher than 260° C. and a compound of Sn and the high-melting-point metal.

12 Claims, 7 Drawing Sheets

(52) U.S. Cl.
CPC .... *H10W 72/07354* (2026.01); *H10W 72/347* (2026.01); *H10W 72/352* (2026.01); *H10W 90/736* (2026.01)

(58) Field of Classification Search
CPC ... H01L 2224/29111; H01L 2224/2912; H01L 2224/29139; H01L 2224/29144; H01L 2224/29147; H01L 2224/29155; H10W 72/30; H10W 72/073; H10W 72/07336; H10W 72/07354; H10W 72/347; H10W 72/352; H10W 72/013; H10W 90/736; B23K 35/26
See application file for complete search history.

(56) References Cited

U.S. PATENT DOCUMENTS

| | | | | |
|---|---|---|---|---|
| 2007/0057021 | A1 | 3/2007 | Ikeda et al. | |
| 2007/0125449 | A1 | 6/2007 | Kajiwara et al. | |
| 2017/0250137 | A1* | 8/2017 | Araki | H01L 24/83 |
| 2019/0122955 | A1 | 4/2019 | Yoshida et al. | |
| 2020/0043888 | A1* | 2/2020 | Tatsumi | H01L 24/83 |

FOREIGN PATENT DOCUMENTS

| | | | |
|---|---|---|---|
| EP | 1760783 | A2 | 3/2007 |
| JP | 2005-340267 | A | 12/2005 |
| JP | 2006-237215 | A | 9/2006 |
| JP | 2007-067158 | A | 3/2007 |
| JP | 2007-152385 | A | 6/2007 |
| JP | 2011-077225 | A | 4/2011 |
| JP | 2014-003339 | A | 1/2014 |
| JP | 2014-117737 | A | 6/2014 |
| JP | 2016-025194 | A | 2/2016 |
| JP | 2020-032448 | A | 3/2020 |
| WO | WO 2016/079881 | A1 | 5/2016 |
| WO | WO 2017/183222 | A1 | 10/2017 |
| WO | WO 2018/199259 | A1 | 11/2018 |

OTHER PUBLICATIONS

International Search Report, mailed Dec. 28, 2021, for International Application No. PCT/JP2021/038131.

International Preliminary Report on Patentability dated Jun. 21, 2022 for International Application No. PCT/JP2021/038131 (without English translation).

Office Action, mailed Jun. 2, 2023, for Taiwanese Application No. 110139824 (without English translation).

* cited by examiner (a)

(b)

(a)
SUPPLY BONDING MATERIALS
15
2
MOUNT ELEMENT
1
15
2
HEAT
1
15
2
(b)
SUPPLY BONDING MATERIALS
7
8
2
MOUNT ELEMENT
1
7
8
7
2
HEAT
1
21
21
5
7
9
2

FIG. 10

| EXAMPLE | BONDING PORTION ON LOWER SIDE OF SEMICONDUCTOR ELEMENT | BONDING PORTION ON UPPER SIDE OF SEMICONDUCTOR ELEMENT | BONDING PEAK TEMPERATURE ON UPPER SIDE OF SEMICONDUCTOR ELEMENT | STRUCTURE | CHIP CRACKING | SECONDARY MOUNTING (260°C) | HEAT DISSIPATION |
|---|---|---|---|---|---|---|---|
| 1 | Sn-Sb-Ag-Cu-BASED SOLDER WITH PROPORTION OF Sb IN RANGE OF 25 TO 40mass% | MIXED MATERIAL OF Cu AND Sn (Cu:Sn=20:80) | 280°C | FIG. 1 | ○ | ○ | ○ |
| 2 | Sn-Sb-Ag-Cu-BASED SOLDER WITH PROPORTION OF Sb IN RANGE OF 25 TO 40mass% | MIXED MATERIAL OF Cu AND Sn (Cu:Sn=30:70) | 280°C | FIG. 1 | ○ | ○ | ○ |
| 3 | Sn-Sb-Ag-Cu-BASED SOLDER WITH PROPORTION OF Sb IN RANGE OF 25 TO 40mass% | MIXED MATERIAL OF Cu AND Sn (Cu:Sn=40:60) | 280°C | FIG. 1 | ○ | ○ | ○ |
| 4 | Sn-Sb-Ag-Cu-BASED SOLDER WITH PROPORTION OF Sb IN RANGE OF 25 TO 40mass% | MIXED MATERIAL OF Ni AND Sn (Ni:Sn=10:90) | 260°C | FIG. 1 | ○ | ○ | ○ |
| 5 | Sn-Sb-Ag-Cu-BASED SOLDER WITH PROPORTION OF Sb IN RANGE OF 25 TO 40mass% | MIXED MATERIAL OF Ni AND Sn (Ni:Sn=20:80) | 260°C | FIG. 1 | ○ | ○ | ○ |
| 6 | Sn-Sb-Ag-Cu-BASED SOLDER WITH PROPORTION OF Sb IN RANGE OF 25 TO 40mass% | MIXED MATERIAL OF Ni AND Sn (Ni:Sn=30:70) | 260°C | FIG. 1 | ○ | ○ | ○ |
| 7 | Sn-Sb-Ag-Cu-BASED SOLDER WITH PROPORTION OF Sb IN RANGE OF 25 TO 40mass% | MIXED MATERIAL OF Ni AND Sn (Ni:Sn=30:70) | 260°C | FIG. 1 | ○ | ○ | ○ |
| 8 | Sn-Sb-Ag-Cu-BASED SOLDER WITH PROPORTION OF Sb IN RANGE OF 25 TO 40mass% | MIXED MATERIAL OF Ag AND Sn (Ag:Sn=30:70) | 260°C | FIG. 1 | ○ | ○ | ○ |
| 9 | Sn-Sb-Ag-Cu-BASED SOLDER WITH PROPORTION OF Sb IN RANGE OF 25 TO 40mass% | MIXED MATERIAL OF Ag AND Sn (Ag:Sn=40:60) | 260°C | FIG. 1 | ○ | ○ | ○ |
| 10 | Sn-Sb-Ag-Cu-BASED SOLDER WITH PROPORTION OF Sb IN RANGE OF 25 TO 40mass% | MIXED MATERIAL OF Au AND Sn (Au:Sn=20:80) | 260°C | FIG. 1 | ○ | ○ | ○ |
| 11 | Sn-Sb-Ag-Cu-BASED SOLDER WITH PROPORTION OF Sb IN RANGE OF 25 TO 40mass% | MIXED MATERIAL OF Au AND Sn (Au:Sn=30:70) | 260°C | FIG. 1 | ○ | ○ | ○ |
| 12 | Sn-Sb-Ag-Cu-BASED SOLDER WITH PROPORTION OF Sb IN RANGE OF 25 TO 40mass% | MIXED MATERIAL OF Cu ALLOY AND Sn-BASED ALLOY (Cu ALLOY : Sn-BASED ALLOY =30:70) | 280°C | FIG. 1 | ○ | ○ | ○ |
| 13 | Sn-Sb-Ag-Cu-BASED SOLDER WITH PROPORTION OF Sb IN RANGE OF 25 TO 40mass% | MIXED MATERIAL OF Ni ALLOY AND Sn-BASED ALLOY (Ni ALLOY : Sn-BASED ALLOY =20:70) | 260°C | FIG. 1 | ○ | ○ | ○ |
| 14 | Sn-Sb-Ag-Cu-BASED SOLDER WITH PROPORTION OF Sb IN RANGE OF 25 TO 40mass% | MIXED MATERIAL OF Ag ALLOY AND Sn-BASED ALLOY (Ag ALLOY : Sn-BASED ALLOY =30:70) | 260°C | FIG. 1 | ○ | ○ | ○ |

FIG. 11

| COMPARATIVE EXAMPLE | BONDING PORTION ON LOWER SIDE OF SEMICONDUCTOR ELEMENT | BONDING PORTION ON UPPER SIDE OF SEMICONDUCTOR ELEMENT | BONDING PEAK TEMPERATURE ON UPPER SIDE OF SEMICONDUCTOR ELEMENT | STRUCTURE | CHIP CRACKING | SECONDARY MOUNTING (260°C) | HEAT DISSIPATION |
|---|---|---|---|---|---|---|---|
| 1 | MIXED MATERIAL OF Cu AND Sn (Cu:Sn=30:70) | MIXED MATERIAL OF Cu AND Sn (Cu:Sn=30:70) | 280°C | FIG. 1 | ○ | ○ | × |
| 2 | MIXED MATERIAL OF Ni AND Sn (Ni:Sn=20:80) | MIXED MATERIAL OF Ni AND Sn (Ni:Sn=20:80) | 260°C | FIG. 1 | ○ | ○ | × |
| 3 | Sn-Sb-Ag-Cu-BASED SOLDER WITH PROPORTION OF Sb IN RANGE OF 25 TO 40mass% | Sn-Sb-Ag-Cu-BASED SOLDER WITH PROPORTION OF Sb IN RANGE OF 25 TO 40mass% | 270 TO 400°C | FIG. 1 | × | – | – |

SEMICONDUCTOR DEVICE INCLUDING SEMICONDUCTOR ELEMENT AND LEAD-FREE SOLDER BONDING MATERIAL AND METHOD FOR MANUFACTURING THE SAME

TECHNICAL FIELD

The present invention relates to a semiconductor device related to power conversion and a method for manufacturing the same, and relates to a semiconductor device used for an in-vehicle AC generator (alternator) that converts an AC output of the AC generator into a DC output or for an inverter, and a method for manufacturing the same.

BACKGROUND ART

A semiconductor device used in an in-vehicle AC generator has a structure that reduces thermal stress generated due to a difference in thermal expansion coefficient between a semiconductor element and an electrode so as to withstand a severe temperature cycle. In addition, since it is installed near an engine, a heat-resistant temperature of 175° C. is required for the semiconductor device. Therefore, for bonding a semiconductor element, for example, high-Pb solder (for example, a Pb—Sn alloy containing 95 wt % of Pb and 5 wt % of Sn and having a solidus line of 300° C. and a liquidus line of 314° C.) having a solidus line of about 300° C. is used. However, from the viewpoint of environmental protection, development of a semiconductor device using a bonding material not containing Pb having a large environmental load is required.

JP 2011-77225 A and JP 2016-25194 A disclose examples of the bonding material in place of Pb solder.

CITATION LIST

Patent Literature

PTL 1: JP 2011-77225 A
PTL 2: JP 2016-25194 A

SUMMARY OF INVENTION

Technical Problem

Zn—Al-based solder having a melting point of about 380° C. is expected as the bonding material in place of Pb solder. The Zn—Al-based solder has a disadvantage of poor wettability, but in recent years, as described in PTL 1, a bonding material having a structure in which Zn and Al are laminated using clad rolling has been developed instead of alloy-based solder, and the bonding material has improved bondability. However, in the case of the bonding material described in PTL 1, when both the upper and lower sides of the semiconductor element are bonded with the Zn—Al-based solder, the thermal expansion coefficient (about 30 ppm/K) of the Zn—Al-based solder is larger than the thermal expansion coefficient (about 3 ppm/K) of the semiconductor element, and thus stress generated due to a difference in thermal expansion coefficient during cooling after the bonding is applied to the semiconductor element, and the semiconductor element may crack. Therefore, in the bonding technique described in PTL 2, Zn—Al-based solder is applied only to the lower surface of the semiconductor element, and the bonding material having a thermal expansion coefficient smaller than that of the Zn—Al-based solder is applied to the upper surface, thereby reducing stress applied to the semiconductor element and suppressing cracking of the semiconductor element at the time of assembling the semiconductor device.

However, in the bonding technique described in PTL 2, although the cracking of the semiconductor element at the time of assembling the semiconductor device can be suppressed, due to the high thermal expansion coefficient of the Zn—Al-based solder, it is not possible to sufficiently suppress the cracking of the semiconductor element that occurs at the time of secondary mounting by a user or at the time of a reliability test. That is, the inventor of the present application has found that, in a case where the bonding technique described in PTL 2 is adopted, when Zn—Al-based solder is used for bonding on the lower surface side of a semiconductor element in a semiconductor device in which both surfaces of the semiconductor element are bonded, the semiconductor element cannot withstand stress applied to the semiconductor element in secondary mounting performed by a user, reliability evaluation, and the like.

An object of the present invention is to provide a technique capable of suppressing cracking of a semiconductor element that occurs at the time of secondary mounting in a semiconductor device.

The foregoing object and novel features of the present invention will become apparent from the description of the present specification and the accompanying drawings.

Solution to Problem

An outline of representative embodiments disclosed in the present application will be briefly described as follows.

A semiconductor device according to an embodiment includes: a semiconductor element including a main surface having a connection electrode and a back surface opposite to the main surface; a first member disposed to face the back surface of the semiconductor element; a second member disposed to face the main surface of the semiconductor element; a first bonding material that bonds the back surface of the semiconductor element and the first member to each other; and a second bonding material that bonds the main surface of the semiconductor element and the second member to each other. Further, the first bonding material is lead-free solder having a melting point higher than 260° C. and a thermal expansion coefficient smaller than that of Zn—Al-based solder, and the second bonding material contains a high-melting-point metal having a melting point higher than 260° C., and a compound of Sn and the high-melting-point metal.

A method for manufacturing a semiconductor device according to an embodiment is a method for manufacturing a semiconductor device having a semiconductor element including a main surface on which a connection electrode is provided and a back surface located on a side opposite to the main surface. The method for manufacturing the semiconductor device includes: (a) a step of supplying a first bonding material onto a first member and further disposing a semiconductor element on the first bonding material such that the first member and the back surface of the semiconductor element face each other with the first bonding material interposed therebetween; and (b) a step of melting the first bonding material at a temperature higher than 260° C. to bond the back surface of the semiconductor element and the first member to each other by the first bonding material after the step (a). The method for manufacturing the semiconductor device further includes (c) a step of supplying a second bonding material onto the main surface of the semiconductor element after the step (b); and (d) a step of disposing a second member on the second bonding material, and heating the second bonding material at a predetermined temperature to bond the main surface of the semiconductor element and the second member to each other by the second bonding material after the step (c). Further, the first bonding material is lead-free solder having a melting point higher than 260° C. and a thermal expansion coefficient smaller than that of Zn—Al-based solder, and the second bonding material contains a high-melting-point metal having a melting point higher than 260° C., and a compound of Sn and the high-melting-point metal.

Advantageous Effects of Invention

An effect obtained by a representative one of the inventions disclosed in the present application will be briefly described as follows.

It is possible to suppress cracking of the semiconductor element that occurs at the time of secondary mounting of the semiconductor device.

BRIEF DESCRIPTION OF DRAWINGS

FIG. 10 is a result diagram illustrating a result of evaluation performed by the semiconductor device in FIG. 1.

FIG. 11 is a result diagram illustrating a result of evaluation performed by a semiconductor device of a comparative example.

DESCRIPTION OF EMBODIMENTS

Figure 1:
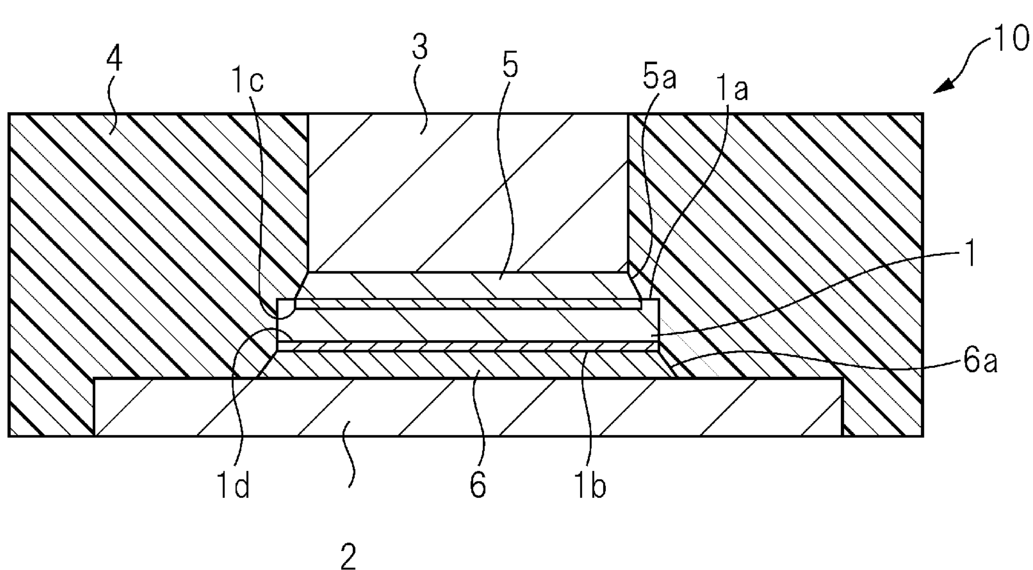
FIG. 1 is a cross-sectional view illustrating a structure of a first example of a semiconductor device according to an embodiment of the present invention.

Hereinafter, embodiments of the present invention will be described with reference to the drawings. In the drawings, elements that are functionally the same may be denoted by the same numbers.

A semiconductor device of the present embodiment is, for example, a semiconductor device used for an in-vehicle AC generator (alternator) that converts an AC output of the AC generator into a DC output or for an inverter.

As illustrated in FIG. 1, a semiconductor device 10 includes a semiconductor element including a main surface 1*a* on which an electrode (connection electrode) 1*c* is provided and a back surface 1*b* located on a side opposite to the main surface 1*a*. In the present embodiment, a case where the semiconductor element is a diode element 1 will be described. Therefore, the diode element 1 also includes an electrode (connection electrode) 1*d* on the back surface 1*b* thereof. The semiconductor device 10 further includes a conductive support member (first member) 2 disposed to face the back surface 1*b* of the diode element 1, a lead electrode body (second member) 3 disposed to face the main surface 1*a* of the diode element 1, a bonding material (first bonding material) 6 that bonds the back surface 1*b* of the diode element 1 and the support member 2 to each other, and a bonding material (second bonding material) 5 that bonds the main surface 1*a* of the diode element 1 and the lead electrode body 3 to each other. The diode element 1, the bonding materials 5 and 6, a part of the support member 2, and a part of the lead electrode body 3 are sealed by a sealing portion 4 made of a sealing resin. However, the other parts of the support member 2 excluding the part of the support member 2 described above and the other parts of the lead electrode body 3 excluding the part of the lead electrode body 3 described above are exposed from the sealing portion 4 as external connection electrodes.

Here, the bonding material (first bonding material) 6 is lead-free solder having a melting point higher than 260° C. and a thermal expansion coefficient smaller than that of Zn—Al-based solder. On the other hand, the bonding material (second bonding material) 5 contains a high-melting-point metal 7 (see FIG. 3) having a melting point higher than 260° C. and a compound (Sn-based compound 9 illustrated in FIG. 3) of Sn and the high-melting-point metal 7.

That is, in the semiconductor device 10, the back surface 1*b* of the diode element 1 is electrically bonded to the conductive support member 2 via a bonding portion 6*a* made of lead-free solder (bonding material 6), while the main surface 1*a* of the diode element 1 is electrically bonded to the lead electrode body 3 via a bonding portion 5*a* made of the bonding material 5 containing the high-melting-point metal 7 having a melting point higher than 260° C., and the compound of Sn and the high-melting-point metal 7.

As in the semiconductor device 10 illustrated in FIG. 1, by bonding only the back surface 1*b* side of the diode element 1 to the support member 2 using lead-free solder (bonding material 6) that is harder than lead solder and has a lower thermal expansion coefficient than Zn—Al-based solder, stress applied to the diode element 1 can be reduced. Further, by bonding the diode element 1 to the lead electrode body 3 on the main surface 1*a* side using the bonding material 5 containing the high-melting-point metal 7 and the compound of Sn and the high-melting-point metal 7, the bonding material 5 can be bonded at a temperature lower than the melting point (for example, about 380° C.) of the lead-free solder (bonding material 6) previously bonded. The bonding material 5 is, for example, a bonding material that can be bonded at a temperature lower than 300° C. As a result, since the temperature range in which the temperature drops to room temperature after solidification of the bonding material 5 is small, stress applied to the diode element 1 can be reduced, and cracking of the diode element 1 can be suppressed.

Figure 2:
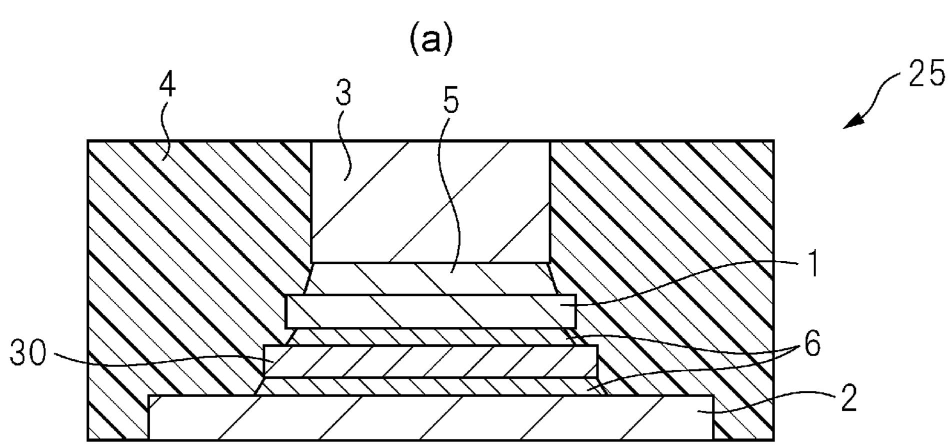
FIG. 2 is a cross-sectional view illustrating a structure of a semiconductor device of a comparative example, in which (a) illustrates a first example and (b) illustrates a second example.
Figure 2:
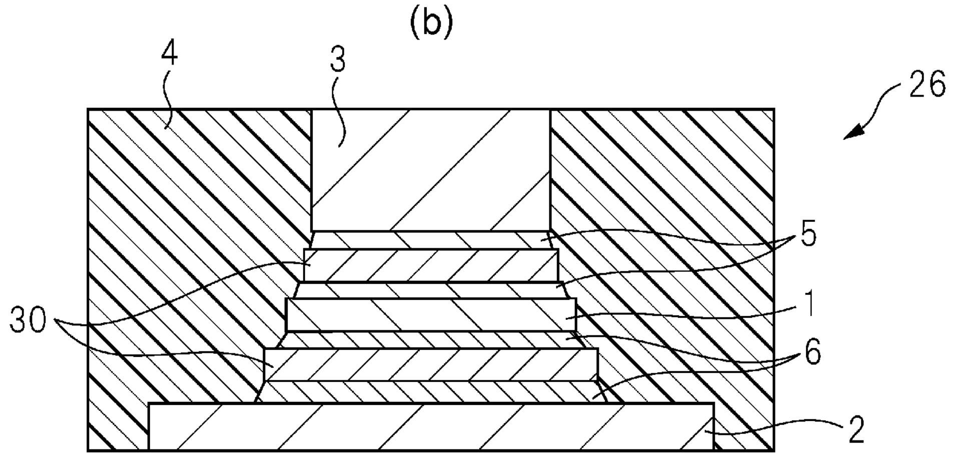

Therefore, in the semiconductor device 10, stress generated in the diode element 1 can be alleviated without inserting a stress buffer material 30 into the bonding portion as illustrated in a comparative example of FIG. 2. Specifically, a semiconductor device 25 illustrated in FIG. 2(*a*) has a structure in which the stress buffer material 30 is inserted only into the bonding material 6 out of the bonding material 5 disposed above a diode element 1 and the bonding material 6 disposed below the diode element 1, and a semiconductor device 26 illustrated in FIG. 2(*b*) has a structure in which the stress buffer material 30 is inserted into both the bonding material 5 disposed above a diode element 1 and the bonding material 6 disposed below the diode element 1. However, in the semiconductor device 10 of the present embodiment, it is not necessary to insert the stress buffer material 30 into both the bonding material 5 and the bonding material 6, and the stress applied to the diode element 1 can be reduced.

Figures 3, 4:
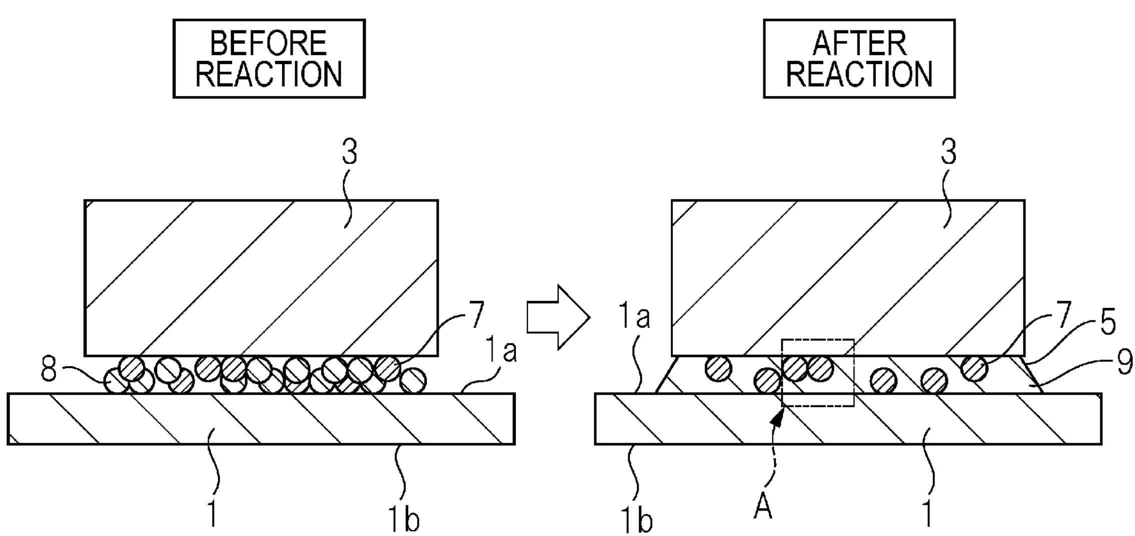
FIG. 3 is a cross-sectional view illustrating states before and after reaction in a bonded state with a second bonding material of the semiconductor device illustrated in FIG. 1.
FIG. 4 is an enlarged partial cross-sectional view illustrating a structure of a portion A in FIG. 3.

In the bonding using the bonding material 5 containing the high-melting-point metal 7 having a melting point higher than 260° C. and the compound of Sn and the high-melting-point metal 7, as illustrated in FIG. 3, after Sn-based solder 8 and the high-melting-point metal 7 are supplied (before reaction), a bonding material obtained by mixing the high-melting-point metal 7 and the Sn-based solder 8 by heating to a predetermined temperature reacts to become a reactant of the high-melting-point metal 7, Sn, and the high-melting-point metal 7 (after the reaction), so that the bonding material does not melt at 260° C. As described above, the bonding material 5 can be bonded at a temperature lower than 300° C. (for example, about 250° C.). As a result, since the temperature range in which the temperature drops to room temperature after solidification of the bonding material 5 is small, stress applied to the diode element 1 can be reduced. As a result, it can withstand secondary mounting (mounting on a printed circuit board 16 illustrated in FIG. 9 described later) at a maximum temperature of 260° C. using solder by a user or the like and a reliability test. That is, it is possible to suppress cracking of the diode element 1 that occurs at the time of secondary mounting of the semiconductor device 10 or at the time of the reliability test.

Figure 5:
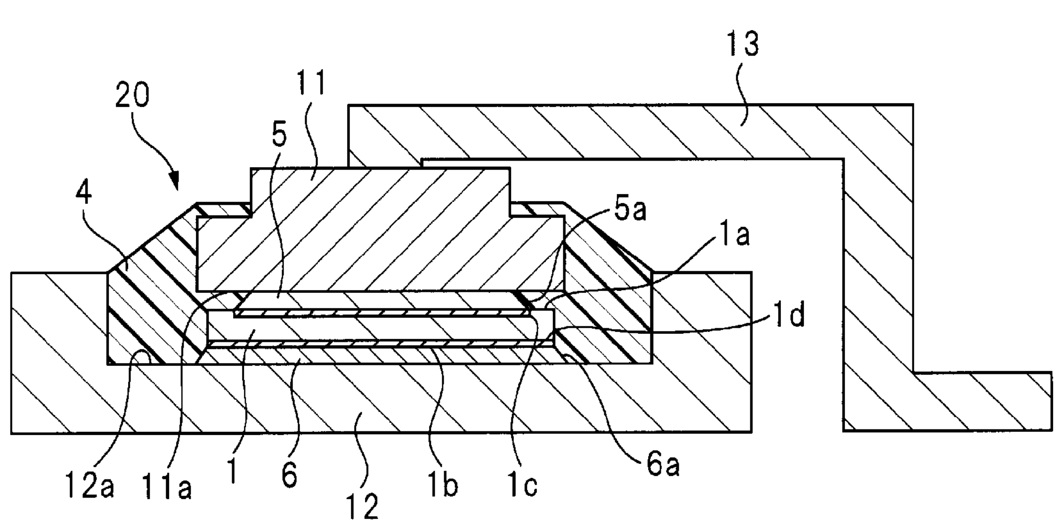
FIG. 5 is a cross-sectional view illustrating a structure of a second example of the semiconductor device according to the embodiment of the present invention.

Next, FIG. 5 illustrates a structure of a semiconductor device 20 of the present embodiment. The semiconductor device 20 has a structure in which a Cu lead (second member) 11 is disposed on the main surface 1*a* side of a diode element 1, and a heat dissipation base (first member) 12 is disposed on the back surface 1*b* side of the diode element 1. That is, in the semiconductor device 20, the back surface 1*b* of the diode element 1 is electrically bonded to the conductive heat dissipation base 12 via a bonding portion 6*a* made of lead-free solder (bonding material 6), while the main surface 1*a* of the diode element 1 is electrically bonded to the Cu lead 11 via a bonding portion 5*a* made of the bonding material 5 containing the high-melting-point metal 7 having a melting point higher than 260° C., and the compound of Sn and the high-melting-point metal 7. The heat dissipation base 12 is a member made of a material having excellent heat dissipation. A drawer lead 13 made of, for example, a Cu alloy is bonded to the Cu lead 11, and the drawer lead 13 serves as an external extraction electrode of the semiconductor device 20.

In the semiconductor device 20, since the heat dissipation base 12 is disposed on the back surface 1*b* side of the diode element 1, the back surface 1*b* side of the diode element 1 is a main part of a heat dissipation path. As illustrated in FIG. 4, since the bonding material 5 (see FIG. 5) disposed on the main surface 1*a* side of the diode element 1 contains the high-melting-point metal 7 having a melting point higher than 260° C. and the Sn-based compound 9 which is a reactant of Sn and the high-melting-point metal 7, voids 21 are easily formed. Since the voids 21 hinder heat transfer, it is preferable not to use, on the heat dissipation side, the bonding material 5 on which the voids 21 are easily formed. Therefore, in the semiconductor device 20, the back surface 1*b* side of the diode element 1 is set as the heat dissipation side, and the back surface 1*b* of the diode element 1 is bonded to the heat dissipation base 12 via the bonding material 6 made of lead-free solder. The heat dissipation base 12 includes a flat portion 12*a* having an area larger than that of the largest flat portion 11*a* among flat portions of the Cu lead 11. As a result, it is possible to transfer heat generated from the diode element 1 to the lower portion side of the diode element 1 via the heat dissipation base 12 while improving efficiency.

That is, in the semiconductor device 20, the heat dissipation side (back surface 1*b* side) of the diode element 1 is bonded with the bonding material 6 made of lead-free solder, and the side (main surface 1*a* side) of the diode element 1 that is not the heat dissipation side is bonded with the bonding material 5 containing the high-melting-point metal 7 higher than 260° C. and the Sn-based compound 9 that is a reactant of Sn and the high-melting-point metal 7. As a result, the heat dissipation side (back surface 1*b* side) of the diode element 1 is not bonded with many voids 21 as in the case of bonding with the bonding material containing the high-melting-point metal 7 and the Sn-based compound 9 which is a reactant of Sn and the high-melting-point metal 7 as illustrated in FIG. 4, which is advantageous for ensuring heat dissipation. Since cracking of the diode element 1 occurs when the upper and lower surfaces of the diode element 1 are bonded with lead-free solder, in the semiconductor device 20, the side (main surface 1*a* side) of the diode element 1 that is not the heat dissipation side is bonded with the bonding material obtained by mixing the high-melting-point metal 7 and the Sn-based compound 9 at a temperature lower than 300° C.

Here, the lead-free solder which is the bonding material 6 of the present embodiment is Sn—Sb—Ag—Cu-based lead-free solder having a solidus temperature of 270° C. to 400° C., and the proportion of Sb in the lead-free solder is in a range of 25 to 40 mass %. As described above, since the Sn—Sb—Ag—Cu-based lead-free solder that has a solidus temperature of 270° C. to 400° C. and is the lead-free solder in which the proportion of Sb in the lead-free solder is in a range of 25 to 40 mass % is used, the bonding portions inside the semiconductor device 10 and the semiconductor device 20 are not melted even at a heating temperature of 260° C. during the secondary mounting when the semiconductor device 10 and the semiconductor device 20 are secondarily mounted. This makes it possible to maintain the bonding at the bonding portions.

The high-melting-point metal 7 is preferably any metal among Cu, Ni, Au, and Ag, or an alloy mainly containing any of Cu, Ni, Au, and Ag. As described above, by adopting any metal among Cu, Ni, Au and Ag or an alloy mainly containing any of Cu, Ni, Au and Ag as the high-melting-point metal 7, it can rapidly react with Sn at the time of bonding and form an intermetallic compound having a melting point higher than 260° C.

In addition, in the semiconductor device 10 and the semiconductor device 20, the thickness of the bonding portion 6*a* made of the bonding material 6 is preferably in a range of 30 to 100 μm. That is, by setting the thickness of the bonding portion 6*a* made of the lead-free solder to the range of 30 to 100 μm, stress applied to the diode element 1 can be reduced. For example, when the solder thickness is larger than 100 μm, heat dissipation is impaired, and when the solder thickness is smaller than 30 μm, stress applied to the diode element 1 increases, so that the diode element 1 may crack. Therefore, the thickness of the bonding portion 6*a* made of the lead-free solder is preferably in a range of 30 to 100 μm.

Figure 6:
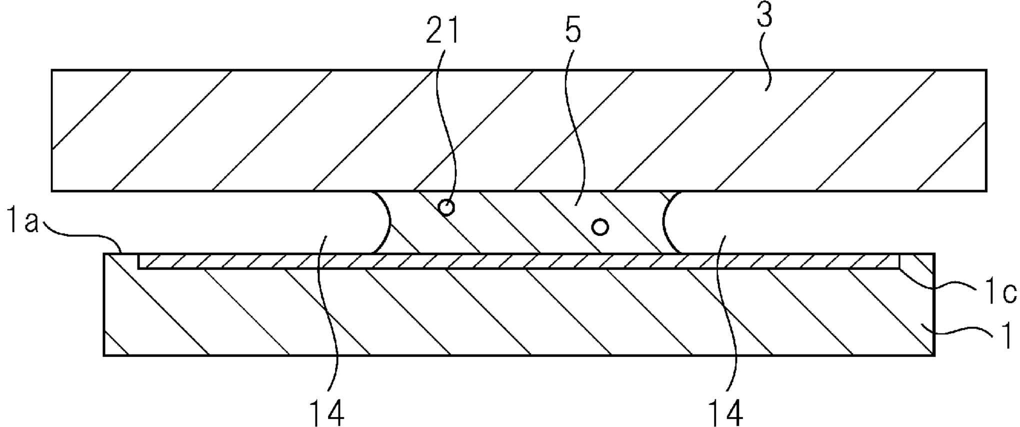
FIG. 6 is a cross-sectional view illustrating a structure of a bonding portion formed of a second bonding material of a semiconductor device of a comparative example.
Figure 7:
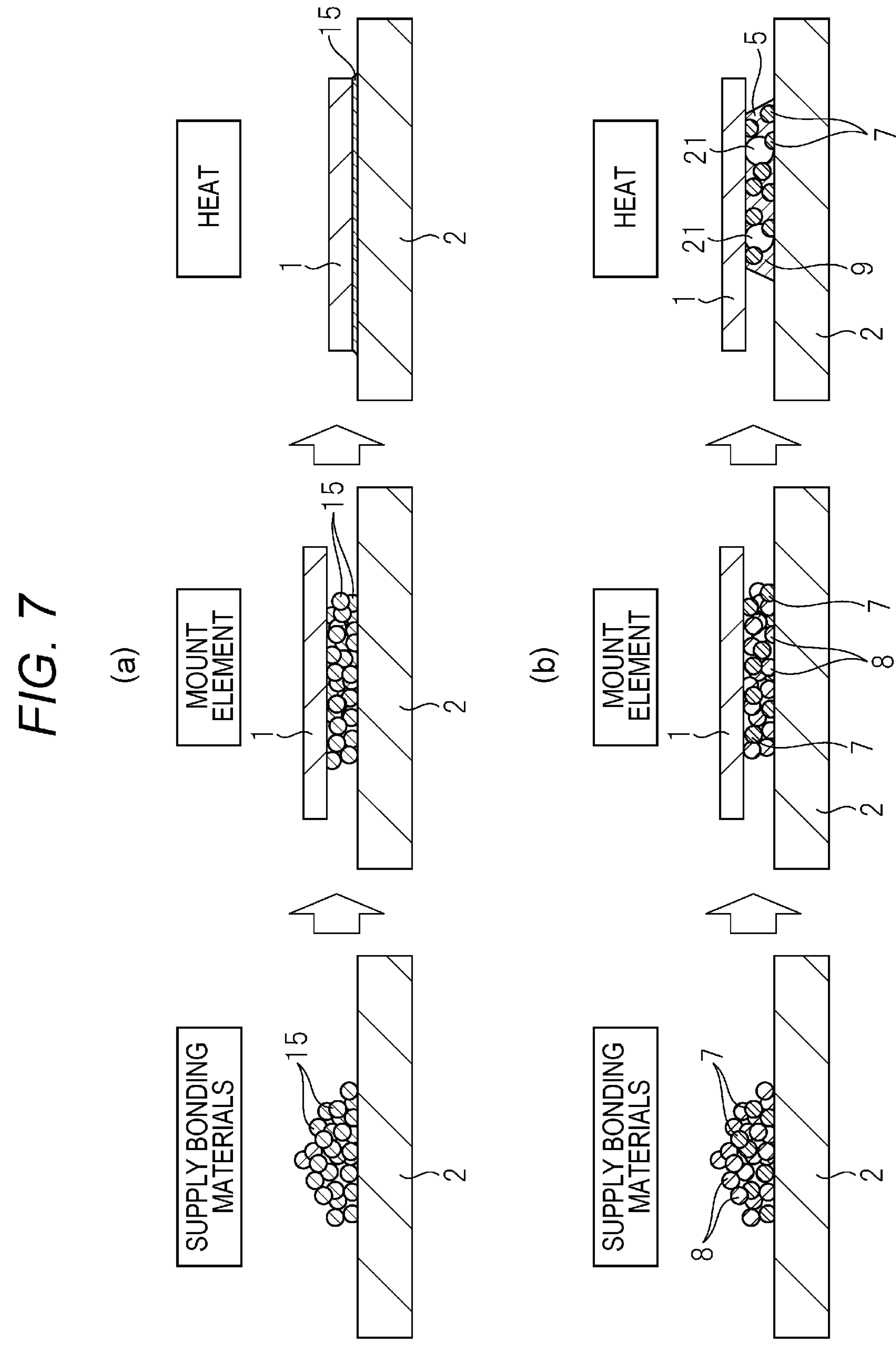
FIG. 7 is a cross-sectional view illustrating a method for bonding a semiconductor element in the semiconductor device of the present invention, in which (a) illustrates a general bonding method using general solder and (b) illustrates a bonding method using the second bonding material.

Next, in the semiconductor device 10 and the semiconductor device 20, as illustrated in FIGS. 1 and 5, the bonding portion 5*a* made of the bonding material 5 is disposed over the entire surface of the electrode (connection electrode) 1*c*. When the bonding material 5 in which the high-melting-point metal 7 and the Sn-based compound 9 are mixed as illustrated in FIG. 3 is used, as illustrated in FIG. 6, the bonding material 5 does not wet and spread over the entire surface of the electrode 1*c* of the diode element 1. For example, in the case of general solder 15 illustrated in FIG. 7(*a*), the solder 15 is supplied onto the support member 2, the diode element 1 is mounted on the solder 15, and then the solder 15 is heated to a predetermined temperature and melted, whereby the solder 15 wets and spreads over the entire bonding surface of the diode element 1. However, in the case of the bonding material 5 in which the high-melting-point metal 7 and the Sn-based compound 9 are mixed as illustrated in FIG. 7(*b*), even when the bonding material 5 is heated to a predetermined bonding temperature, the bonding material 5 does not wet and spread over the entire bonding surface of the diode element 1. That is, the bonding material 5 has poor wettability and spreadability. In this case, as illustrated in FIG. 6, a space portion 14 is formed between the diode element 1 and the second member such as the lead electrode body 3 or the Cu lead 11, and energization and heat dissipation are not sufficiently performed between the diode element 1 and the second member due to the space portion 14.

Therefore, in the semiconductor device 10 and the semiconductor device 20 of the present embodiment, the bonding material 5 is supplied by printing onto the main surface 1*a* of the diode element 1 during the assembly of the semiconductor devices 10 and 20. As a result, the bonding portion 5*a* made of the bonding material 5 can be formed over the entire surface of the electrode 1*c*. That is, it is possible to secure a bonding area of the bonding material 5 between the diode element 1 and the second member such as the lead electrode body 3 or the Cu lead 11, and it is possible to improve conductivity and heat dissipation between the diode element 1 and the second member.

Next, a method for manufacturing the semiconductor device according to the present embodiment will be described. Here, the semiconductor device 10 illustrated in FIG. 1 will be described, but the same applies to the semiconductor device 20 illustrated in FIG. 5.

As illustrated in FIG. 1, first, the bonding material 6 is supplied onto the support member 2. Here, the bonding material 6 is lead-free solder having a melting point higher than 260° C. and a thermal expansion coefficient smaller than that of Zn—Al-based solder. After the bonding material 6 is supplied, the diode element 1 is disposed on the bonding material 6 such that the support member 2 and the back surface 1*b* of the diode element 1 face each other with the bonding material 6 interposed therebetween. Thereafter, the bonding material 6 is melted at a temperature higher than 260° C., and the back surface 1*b* of the diode element 1 and the support member 2 are bonded to each other by the bonding material 6.

After the diode element 1 is bonded to the support member 2 by the bonding material 6, the bonding material 5 is supplied onto the main surface 1*a* of the diode element 1. Here, as illustrated in FIG. 3, the bonding material 5 is a bonding material containing the high-melting-point metal 7 having a melting point higher than 260° C., and the compound of Sn and the high-melting-point metal 7. Thereafter, the lead electrode body 3 is disposed on the bonding material 5, and the bonding material 5 is heated at a predetermined temperature to bond the main surface 1*a* of the diode element 1 and the lead electrode body 3 to each other by the bonding material 5.

According to the above bonding method, first, only the lower surface (back surface 1*b*) side of the diode element 1 is bonded with the lead-free solder (bonding material 6), and cooled to room temperature so as to be solidified. Thereafter, the bonding material 5 containing the high-melting-point metal 7 and the Sn-based compound 9 is supplied to the upper surface (main surface 1*a*) side of the diode element 1, and the diode element 1 is bonded at a temperature lower than the melting point of the lead-free solder previously bonded, whereby the stress applied to the diode element 1 can be reduced. As a result, the occurrence of cracking of the diode element 1 can be suppressed.

The bonding material 5 is a paste-like bonding material formed by mixing powder of any metal among Cu, Ni, Au, and Ag or an alloy mainly containing any of Cu, Ni, Au, and Ag with powder of a Sn-based alloy. As described above, any metal among Cu, Ni, Au and Ag or an alloy mainly containing any of Cu, Ni, Au and Ag is used as the high-melting-point metal 7 and rapidly reacts with Sn at the time of bonding, whereby an intermetallic compound having a melting point higher than 260° C. can be formed.

The proportion of the high-melting-point metal 7, by weight, in the bonding material 5 is preferably in a range of 10 to 40%. The proportion of the high-melting-point metal 7, by weight, in the bonding material 5 containing the high-melting-point metal 7 such as Cu, Ni, Au, or Ag and the Sn-based compound 9 is in a range of 10 to 40%, and thus the wettability of the bonding material 5 can be easily secured when the bonding material 5 is bonded to the diode element 1, and as a result, bonding strength between the bonding material 5 and the diode element 1 can be increased. For example, when the proportion of the high-melting-point metal 7, by weight, in the bonding material 5 is less than 10%, a phenomenon that Sn remains when the high-melting-point metal 7 reacts with Sn occurs. Since Sn has a melting point lower than 260° C., there is a possibility that the bonding cannot be maintained when secondary mounting is performed at 260° C. by a user. On the other hand, when the proportion of the high-melting-point metal 7, by weight, in the bonding material 5 is higher than 40%, there may be a problem that sufficient wettability of the bonding material 5 cannot be secured or many voids are formed. Therefore, by setting the proportion of the high-melting-point metal 7, by weight, in the bonding material 5 to the range of 10 to 40%, the wettability of the bonding material 5 can be secured, and the bonding strength between the bonding material 5 and the diode element 1 can be increased.

Figure 8:
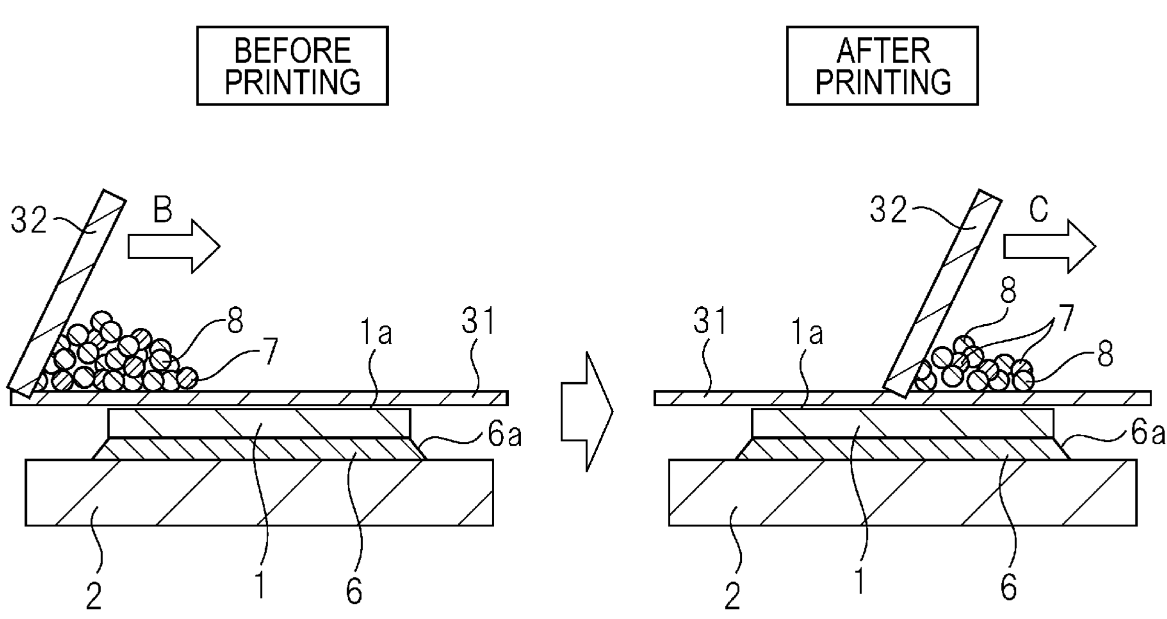
FIG. 8 is a cross-sectional view illustrating a bonding state of the second bonding material by a printing method for the semiconductor device of the present invention.

In assembling the semiconductor device 10, when the bonding material 5 is supplied onto the main surface 1*a* of the diode element 1, it is preferable to supply the high-melting-point metal 7 and the Sn-based solder 8 by printing as illustrated in FIG. 8. Specifically, when the lower surface (back surface 1*b*) side of the diode element 1 is bonded first with the lead-free solder (bonding material 6), the bonding material 5 containing the high-melting-point metal 7 and the compound (Sn-based compound 9, which is also a mixture) of the Sn-based solder 8 as illustrated in FIG. 3 can be supplied to the upper surface (main surface 1*a*) side of the diode element 1 by printing. As illustrated in FIG. 6, the bonding material 5 containing the high-melting-point metal 7 and the compound of the Sn-based solder 8 does not wet and spread over the entire electrode 1*c* of the diode element 1. Therefore, as illustrated in FIG. 8, the high-melting-point metal 7 and the Sn-based solder 8 are supplied to the electrode size of the diode element 1 in advance by printing using a printing mask 31 and a printing squeegee 32. Specifically, the high-melting-point metal 7 and the Sn-based solder 8 are supplied onto the printing mask 31 in a state where the printing mask 31 is disposed on the electrode of the diode element 1, and then the printing squeegee 32 is moved from the arrow B to the arrow C, whereby the high-melting-point metal 7 and the Sn-based solder 8 can be supplied over the entire electrode of the diode element 1. As a result, the bonding material 5 containing the high-melting-point metal 7 and the compound of the Sn-based solder 8 can be formed over the entire electrode of the diode element 1 by being heated at a predetermined temperature at the time of bonding, and the area of the bonding by the bonding material 5 can be reliably secured. Accordingly, it is possible to improve the conductivity and heat dissipation of the diode element 1 via the bonding material 5.

When the diode element 1 and the lead electrode body 3 are bonded to each other by the bonding material 5 in the assembly of the semiconductor device 10, it is preferable that the bonding material 5 be heated at a temperature lower than 300° C. to bond the main surface 1*a* of the diode element 1 and the lead electrode body 3 to each other by the bonding material 5. As described above, the bonding material 5 is a bonding material that can be bonded at a temperature lower than 300° C. (for example, about 250° C.). For example, the reaction of the bonding material 5 containing the high-melting-point metal 7 and the compound (Sn-based compound 9, which is also a mixture) of the Sn-based solder 8 is accelerated at the bonding temperature, and thus, when the bonding temperature is high (for example, a bonding temperature of more than 300° C.), the reduction range of the temperature increases when the bonding material 5 is cooled to room temperature, and the stress applied to the diode element 1 increases. As a result, the diode element 1 cracks. Therefore, by heating at a temperature lower than 300° C. and bonding with the bonding material 5, it is possible to suppress the cracking due to stress of the diode element 1.

Figure 9:
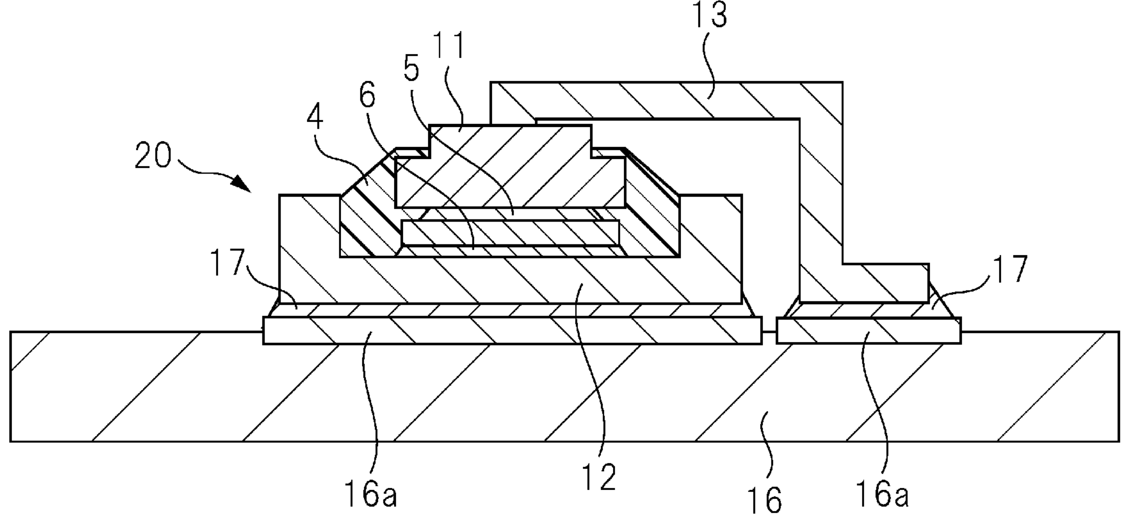
FIG. 9 is a cross-sectional view illustrating a structure of secondary mounting of the semiconductor device according to the embodiment of the present invention.

Next, a structure of secondary mounting of the semiconductor device according to the present embodiment will be described with reference to FIG. 9. The secondary mounting is, for example, mounting on the printed circuit board or the like performed by a user or the like. Here, a structure in which the semiconductor device 20 is secondarily mounted on the printed circuit board 16 will be described. As illustrated in FIG. 9, the semiconductor device 20 is mounted on the printed circuit board 16. Specifically, the drawer lead 13 and the heat dissipation base 12 of the semiconductor device 20 are bonded to a terminal portion 16*a* of the printed circuit board 16 by solder 17. The heating temperature during the secondary mounting is 260° C. at the maximum.

The bonding material 6 used in the assembly of the semiconductor device 20 is lead-free solder having a melting point higher than 260° C. Further, the bonding material 5 contains the high-melting-point metal 7 having a melting point higher than 260° C. and the compound of Sn and the high-melting-point metal 7, and the melting point of the bonding material 5 is a temperature much higher than 260° C. Therefore, even if the semiconductor device 20 is secondarily mounted at a temperature of 260° C., a defect does not occur at a bonding portion inside the semiconductor device 20.

Next, a result of evaluation performed in Examples 1 to 14 in which the semiconductor device 10 illustrated in FIG. 1 is used will be described with reference to FIG. 10. In Examples 1 to 14, various combinations of the bonding material 5 and the bonding material 6 were evaluated for chip cracking (cracking of the diode element 1), secondary mounting, and heat dissipation, and the evaluation results are represented by ○ and x. In FIG. 10, the lower bonding portion of the semiconductor element is the bonding material 6, and the upper bonding portion of the semiconductor element is the bonding material 5. In addition, the bonding peak temperature on the upper side of the semiconductor element is the highest bonding temperature at the bonding where no chip cracking occurs. Furthermore, regarding the heat dissipation, a change in a voltage when a constant current flows is measured, and ○ or x is determined for the heat dissipation on the basis of whether or not the amount of change in the voltage is larger than a set threshold.

More specifically, various bonding materials (bonding materials 6) on the lower side of the semiconductor element are supplied to the support member 2 made of Cu and having Ni metalized, the diode element 1 having a thickness of 0.5 mm is disposed thereon, and heated to a desired temperature in a reducing atmosphere of 100% $H_2$ or $N_2+H_2$ by a reflow furnace such that the support member 2 and the diode element 1 are bonded to each other. After cooling, the bonding material 5 was laminated on the diode element 1 bonded to the support member 2 made of Cu, the lead electrode body 3 made of Cu and having Ni metalized was further laminated on the bonding material 5, and bonding was performed at the bonding peak temperature illustrated in FIG. 10 in a reducing atmosphere of $N_2+H_2$. After the bonding, the periphery of the bonding portion was sealed with a sealing resin.

The electrical characteristics of the semiconductor device 10 thus assembled were measured, and the presence or absence of a cracking in the diode element 1 was evaluated. In the evaluation, five semiconductor devices 10 were evaluated in each of Examples 1 to 14, a case where there was no cracking in the diode element 1 was evaluated as ○, and a case where there was even one cracking was evaluated as x. As a result of the evaluation, as illustrated in FIG. 10, cracking did not occur in the diode element 1 in any of Examples 1 to 14. In addition, the diode element 1 having no cracking was reflowed at a maximum temperature of 260° C., the secondary mounting resistance was confirmed, and it was confirmed whether there was a variation in electrical characteristics. As a result, no variation was confirmed in any of the cases. In addition, the heat dissipation was confirmed, and solder having better heat dissipation characteristics than the conventional lead solder was determined as ○, and solder having worse heat dissipation characteristics was determined as x. As a result, ○ was obtained in all Examples.

On the other hand, as in Comparative Examples 1 to 3 illustrated in FIG. 11, when both the upper and lower sides of the semiconductor element (diode element 1) were bonded using the same bonding material, cracking of the semiconductor element occurred in at least one or more of the five semiconductor devices 10 in Comparative Example 3. In Comparative Examples 1 and 2, cracking of the semiconductor element was suppressed, and the semiconductor element could withstand secondary mounting, but the heat dissipation was worse than that in the case of using the conventional lead solder, and was determined as x.

As described above, according to the semiconductor device and the method for manufacturing the same according to the present embodiment, it is possible to reduce stress generated at the time of assembling the semiconductor device and applied to the diode element 1, and as a result, it is possible to suppress chip cracking (cracking of the diode element 1) at the time of assembling and under a use environment. After the bonding, the bonding can be maintained for secondary mounting at a heating temperature of 260° C. at the maximum, a reliability test, and the like. Furthermore, by bonding only one side (for example, the back surface 1*b* side) of the diode element 1 with the lead-free solder (bonding material 6), heat dissipation of the diode element 1 can be secured.

Note that the present invention is not limited to the above-described embodiments and includes various modifications. For example, the above-described embodiments have been described in detail for easy understanding of the present invention, and are not necessarily limited to those including all the described configurations.

In addition, a part of the configuration of a certain embodiment can be replaced with the configuration of another embodiment, and the configuration of a certain embodiment can be added to the configuration of another embodiment. In addition, for a part of the configuration of each embodiment, it is possible to add, delete, and replace another configuration. Note that the respective members and the relative sizes illustrated in the drawings are simplified and idealized in order to describe the present invention in an easily understandable manner, and have a more complex shape in terms of implementation.

For example, in the above embodiments, the case where the semiconductor element is a diode element has been described, but the semiconductor element may be a transistor element or the like other than the diode element.

REFERENCE SIGNS LIST

1 diode element (semiconductor element)
1*a* main surface
1*b* back surface
1*c*, 1*d* electrode (connection electrode)
2 support member (first member)
3 lead electrode body (second member)
4 sealing portion
5 bonding material (second bonding material)
5*a* bonding portion
6 bonding material (first bonding material)
6*a* bonding portion
7 high-melting-point metal
8 Sn-based solder
9 Sn-based compound
10 semiconductor device
11 Cu lead (second member)
11*a* flat portion
12 heat dissipation base (first member)
12*a* flat portion
13 drawer lead
14 space portion
15 solder
16 printed circuit board
16*a* terminal portion
17 solder
20 semiconductor device
21 void
25, 26 semiconductor device
30 stress buffer material
31 printing mask
32 printing squeegee

The invention claimed is:

1. A semiconductor device comprising:

a semiconductor element including a main surface on which a connection electrode is provided and a back surface located on a side opposite to the main surface;

a first member disposed to face the back surface of the semiconductor element;

a second member disposed to face the main surface of the semiconductor element;

a first bonding material that bonds the back surface of the semiconductor element and the first member to each other; and a second bonding material that bonds the main surface of the semiconductor element and the second member to each other, wherein the first bonding material is lead-free solder having a melting point higher than 260° C. and a thermal expansion coefficient smaller than that of Zn—Al-based solder, and the second bonding material contains a high-melting-point metal having a melting point higher than 260° C., and a compound of Sn and the high-melting-point metal, and a proportion of the high-melting-point metal by weight contained in the second bonding material is 10 to 40%.

2. The semiconductor device according to claim 1, wherein the first member includes a flat portion having an area larger than an area of a largest flat portion included in the second member.

3. The semiconductor device according to claim 2, wherein the lead-free solder is Sn—Sb—Ag—Cu-based lead-free solder having a solidus temperature of 270° C. to 400° C., and a proportion of Sb in the lead-free solder is in a range of 25 to 40 mass %.

4. The semiconductor device according to claim 1, wherein the second bonding material can be bonded at a temperature lower than 300° C.

5. The semiconductor device according to claim 1, wherein the high-melting-point metal is any metal among Cu, Ni, Au, and Ag, or an alloy mainly containing any of Cu, Ni, Au, and Ag.

6. The semiconductor device according to claim 5, wherein a thickness of a bonding portion made of the first bonding material is in a range of 30 to 100 μm.

7. The semiconductor device according to claim 5, wherein the second bonding material is disposed over an entire surface of the connection electrode.

8. The semiconductor device according to claim 5, wherein the semiconductor element is a diode element in which the connection electrode is formed on the back surface.

9. A method for manufacturing a semiconductor device that has a semiconductor element including a main surface on which a connection electrode is provided and a back surface located on a side opposite to the main surface, the method comprising:

(a) a step of supplying a first bonding material onto a first member and further disposing the semiconductor element on the first bonding material such that the first member and the back surface of the semiconductor element face each other with the first bonding material interposed therebetween;

(b) a step of melting the first bonding material at a temperature higher than 260° C. to bond the back surface of the semiconductor element and the first member to each other by the first bonding material after the step (a);

(c) a step of supplying a second bonding material onto the main surface of the semiconductor element after the step (b); and (d) a step of disposing a second member on the second bonding material, and heating the second bonding material at a predetermined temperature to bond the main surface of the semiconductor element and the second member to each other by the second bonding material after the step (c), wherein the first bonding material is lead-free solder having a melting point higher than 260° C. and a thermal expansion coefficient smaller than that of Zn—Al-based solder, and the second bonding material contains a high-melting-point metal having a melting point higher than 260° C., and a compound of Sn and the high-melting-point metal, and a proportion of the high-melting-point metal by weight contained in the second bonding material is 10 to 40%.

10. The method for manufacturing a semiconductor device according to claim 9, wherein the second bonding material is a paste-like bonding material formed by mixing powder of any metal among Cu, Ni, Au, and Ag or an alloy mainly containing any of Cu, Ni, Au, and Ag with powder of a Sn-based alloy.

11. The method for manufacturing a semiconductor device according to claim 10, wherein in the step (c), the second bonding material is supplied by printing the second bonding material onto the main surface of the semiconductor element.

12. The method for manufacturing a semiconductor device according to claim 9, wherein in the step (d), the second bonding material is heated at a temperature lower than 300° C., and the main surface of the semiconductor element and the second member are bonded to each other by the second bonding material.

* * * * *